United States Patent
Kim

(10) Patent No.: US 8,044,916 B2
(45) Date of Patent: Oct. 25, 2011

(54) SHIFT REGISTER AND ORGANIC LIGHT EMITTING DISPLAY HAVING THE SAME

(75) Inventor: Tae-Gyu Kim, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 900 days.

(21) Appl. No.: 11/381,615

(22) Filed: May 4, 2006

(65) Prior Publication Data
US 2006/0271757 A1    Nov. 30, 2006

(30) Foreign Application Priority Data
May 24, 2005   (KR) .................. 10-2005-0043822

(51) Int. Cl.
G09G 3/36    (2006.01)
G11C 19/00    (2006.01)

(52) U.S. Cl. ............. 345/100; 345/98; 345/99; 377/68; 377/77

(58) Field of Classification Search .................. 345/55, 345/82–84; 377/68–81
See application file for complete search history.

(56) References Cited

U.S. PATENT DOCUMENTS

| | | | |
|---|---|---|---|
| 4,291,240 A * | 9/1981 | Rosler | 327/259 |
| 4,856,034 A * | 8/1989 | Takeuchi et al. | 377/74 |
| 4,920,282 A * | 4/1990 | Muraoka et al. | 327/218 |
| 6,373,458 B1 | 4/2002 | Yamakura et al. | |
| 2003/0012330 A1 * | 1/2003 | Osame | 377/2 |
| 2004/0027167 A1 | 2/2004 | Mizumoto et al. | |
| 2004/0207615 A1 * | 10/2004 | Yumoto | 345/211 |

FOREIGN PATENT DOCUMENTS

| | | |
|---|---|---|
| JP | 05-128889 | 5/1993 |
| JP | 06-068691 | 3/1994 |
| JP | 10-040692 | 2/1998 |
| JP | 10-134590 | 5/1998 |
| JP | 10-334685 | 12/1998 |
| JP | 2001-135093 | 5/2001 |
| JP | 2004-245953 | 9/2004 |
| JP | 2004-072511 | 12/2009 |
| KR | 10-2000-0035164 | 6/2000 |

\* cited by examiner

*Primary Examiner* — Sumati Lefkowitz
*Assistant Examiner* — Jonathan Horner
(74) *Attorney, Agent, or Firm* — H.C. Park & Associates, PLC

(57) ABSTRACT

A shift register includes a sampling circuit to sample an input signal in response to a start pulse and two clock signals having different duty ratios from each other, a holding circuit to hold the input signal in response to an output signal of the sampling circuit and the two clock signals, an inverter to invert the output signal of the sampling circuit or the holding circuit, and a NAND gate to receive the output signal of the sampling circuit or the holding circuit and the output signal of the inverter and perform a logical operation on the received output signals to output an output signal. The first clock signal has a duty ratio smaller than the second clock signal. The sampling circuit and the holding circuit have a three-stack structure in which three transistors are coupled with one another in series.

24 Claims, 8 Drawing Sheets

SHIFT REGISTER AND ORGANIC LIGHT EMITTING DISPLAY HAVING THE SAME

CROSS-REFERENCE TO RELATED APPLICATION

This application claims priority to and the benefit of Korean Patent Application No. 10-2005-0043822, filed May 24, 2005, which is hereby incorporated by reference for all purposes as if fully set forth herein.

BACKGROUND OF THE INVENTION

1. Field of the Invention

The present invention relates to a shift register and an organic light emitting display having the same, and more particularly, to a shift register that is capable of preventing malfunction caused by skew and slop between clock signals used in the shift register.

2. Discussion of the Background

Generally, a shift register shifts bits of information at least one position to the right or left. Such a shift register may include cascaded flip-flops in which an output of the first flip-flop is sequentially connected to an input of the immediately following flip-flop. All flip-flops simultaneously receive the same clock signal and inverted clock signal so that data shift simultaneously occurs in a stage-by-stage manner.

Shift registers are widely used in various fields. In particular, in display devices such as liquid crystal displays (LCDs), organic light emitting displays, plasma display panels (PDPs), and so forth, the shift register is typically used in a scan driving unit, which sequentially supplies a scan signal, or in an emission control driving unit, which controls light emission.

FIG. 1 is a circuit diagram of a conventional shift register, and FIG. 2 is a timing diagram for signals of the shift register of FIG. 1. The shift register has a plurality of flip-flops that are connected to each other in series, and FIG. 1 shows the case where the shift register has two flip-flops as a basic unit. Additionally, the shift register of FIG. 1 has a four-stack structure in which four transistors are stacked between the positive power supply voltage VDD and the negative power supply voltage VSS.

Referring to FIG. 1 and FIG. 2, a conventional shift register may include a first flip-flop FF1, which includes transistors MN1, MN2, MN3, MN4, MN5, MP1, MP2, MP3, MP4, and MP5, and a second flip flop FF2, which includes transistors MN6, MN7, MN8, MN9, MN10, MP6, MP7, MP8, MP9, and MP10. The two flip-flops FF1 and FF2 are connected to each other in series, and an output signal of the first flip-flop FF1, which receives a start pulse SP as an input signal, becomes an input signal of the second flip-flop FF2. Accordingly, the first flip flop FF1 delivers the input start pulse SP to the second flip-flop FF2 per one or half period of a clock signal CLK in synchronization with the clock signal CLK and an inverted clock signal CLKB.

Each flip-flop FF1 and FF2 repeatedly performs sampling and holding of the input signal in response to states of the clock signal CLK and the inverted clock signal CLKB of FIG. 2. That is, the first flip-flop FF1 detects the state of the input start pulse SP at a sampling time T1 and maintains that state at a holding time T2 in response to the input of the start pulse SP. The second flip-flop FF2 operates opposite to the first flip-flop FF1 such that it delivers the start pulse SP by sequentially sampling the state held by the first flip-flop FF1 and delivering it to the next flip-flop.

In the timing diagram of FIG. 2, which shows normal operation of the clock signal CLK and the inverted clock signal CLKB, a first output signal SR1 transitions to a low level just after the transition of the clock signal CLK and the inverted clock signal CLKB. Accordingly, a sampling region and a holding region of each flip-flop are correctly discriminated to generate a normal output signal.

However, as described below, the conventional shift register of FIG. 1 may malfunction when skew occurs between the clock signal CLK and the inverted clock signal CLKB or when slop increases.

FIG. 3 is a timing diagram showing an error of an output signal SR2 due to skew between the clock and inverted clock signals input to the shift register.

Referring to FIG. 3, the timing diagram shows skew in the clock signal CLK prior to the inverted clock signal CLKB. That is, referring to the skew interval, the inverted clock signal CLKB maintains a low level even after the clock signal CLK and the first output signal SR1 transition to a low level. Accordingly, transistors MN1 and MN3 of the first flip-flop FF1 and transistors MN6 and MN8 of the second flip-flop FF2 of FIG. 1 are turned off, and transistors MP2 and MP4 of the first flip-flop FF1 and transistors MP7 and MP9 of the second flip-flop FF2 are turned on. In this case, as FIG. 3 shows, the second output signal SR2 transitions to a low level instead of maintaining the high level. Hence, an abnormal output signal may be output when the magnitude of the skew between the clock signal CLK and the inverted clock signal CLKB increases to more than a predetermined value.

FIG. 4 is a timing diagram showing an output signal error due to slop between the clock and inverted clock signals input to the conventional shift register. Here, the time from the moment an input signal is sampled by any flip-flop to the moment when the input signal is output is defined as Ts. Additionally, it is assumed that skew between the clock signals does not occur, and the clock signal CLK and the inverted clock signal CLKB are converted as shown in FIG. 4.

FIG. 4 shows the time Ton in which the clock signal CLK transitions from a threshold voltage Vthn of an N-type transistor through a threshold voltage Vthp of a P-type transistor while the inverted clock signal CLKB transitions from the threshold voltage Vthp through the threshold voltage Vthn.

Transistors MP2, MP4, MN1, MN3, MP7, MP9, MN6, and MN8 of FIG. 1 are turned on during the time Ton in which the slop occurs. Accordingly, when the slop of the clock signal CLK and the inverted clock signal CLKB increases and Ton exceeds Ts, output signals SR1, SR2, and SR3 of respective flip-flops FF1, FF2, and FF3, which must sequentially perform sampling and holding operations, operate as shown in FIG. 4. That is, each flip-flop FF1, FF2, and FF3 becomes a buffer in which two inverters are connected to each other in series. Accordingly, malfunction occurs in that the output signal SR1 becomes the next output signal SR2.

External noise or electromagnetic inference (EMI) may cause skew or slop in the clock signal CLK and the inverted clock signal CLKB, thereby causing an abnormal signal to be output from the shift register. This abnormal signal causes malfunction in a display device to which it is applied.

SUMMARY OF THE INVENTION

The present invention provides a shift register that sequentially delivers an input signal using two independent clock signals having different duty ratios, and an organic light emitting display having the same.

Additional features of the invention will be set forth in the description which follows, and in part will be apparent from the description, or may be learned by practice of the invention.

The present invention discloses an organic light emitting display including a pixel unit displaying an image and having a plurality of pixels arranged at intersections of a plurality of data lines, scan lines and emission control lines, a scan driving unit coupled with the scan lines to apply selection signals for activating pixels, a data driving unit coupled with the data lines to apply data signals to the activated pixels, and an emission control driving unit coupled with the emission control lines to apply emission control signals to the activated pixels having the applied data signals. The emission control driving unit includes first and second shift registers. The first shift register outputs a first emission control signal for one period of a first clock signal in response to a start pulse, a first clock signal, and a second clock signal. The second shift register outputs a second emission control signal for one period of the second clock signal in response to an input signal, the first clock signal, and the second clock signal delivered from the first shift register. The first and second shift registers are repeatedly and serially connected by a number corresponding to the number of emission control lines, and the first clock signal has a smaller duty ratio than the second clock signal.

The present invention also discloses a shift register including first and second shirt registers. The first shift register outputs a first signal for one period of a first clock signal in response to a start pulse, the first clock signal, and a second clock signal. The second shift register outputs a second signal for one period of the second clock signal in response to an input signal, the first clock signal, and the second clock signal delivered from the first shift register. The first clock signal has a smaller duty ratio than the second clock signal.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
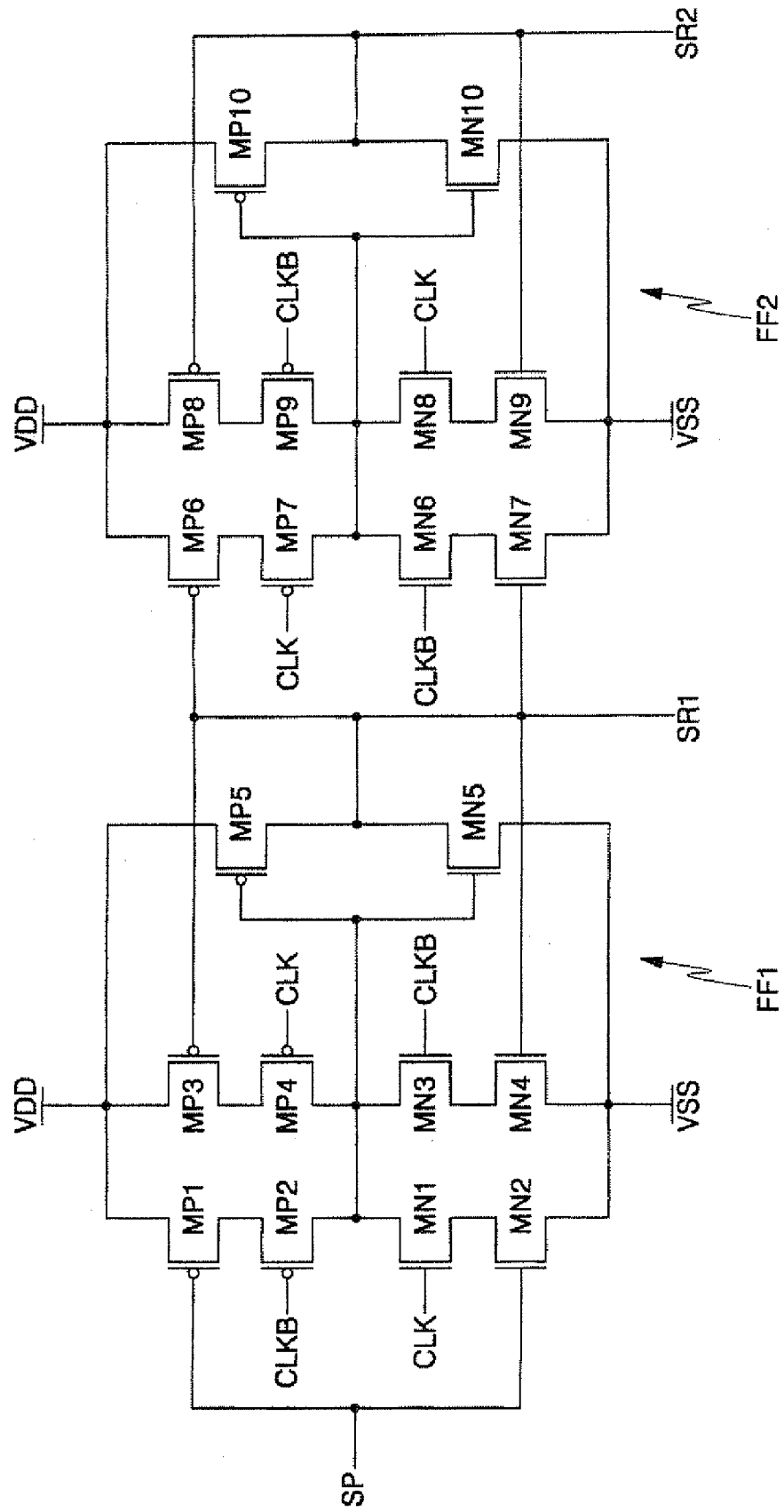
FIG. 1 is a circuit diagram of a conventional shift register.
Figure 2:
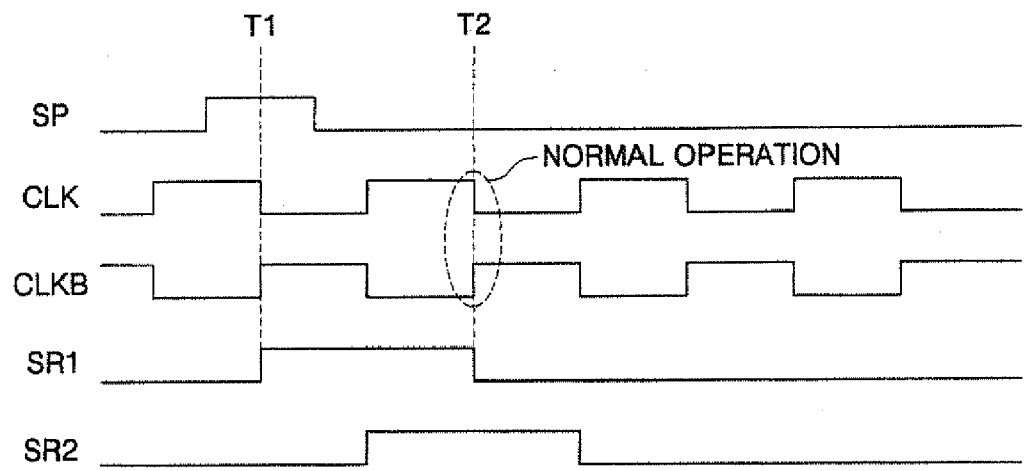
FIG. 2 is a timing diagram showing operations of the shift register of FIG. 1.
Figure 3:
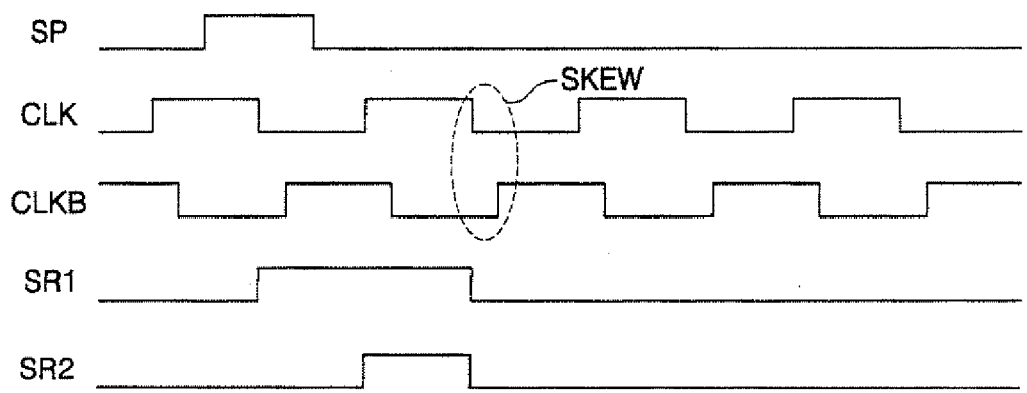
FIG. 3 is a timing diagram showing an output signal error due to skew between clock and inverted clock signals input to the conventional shift register.
Figure 4:
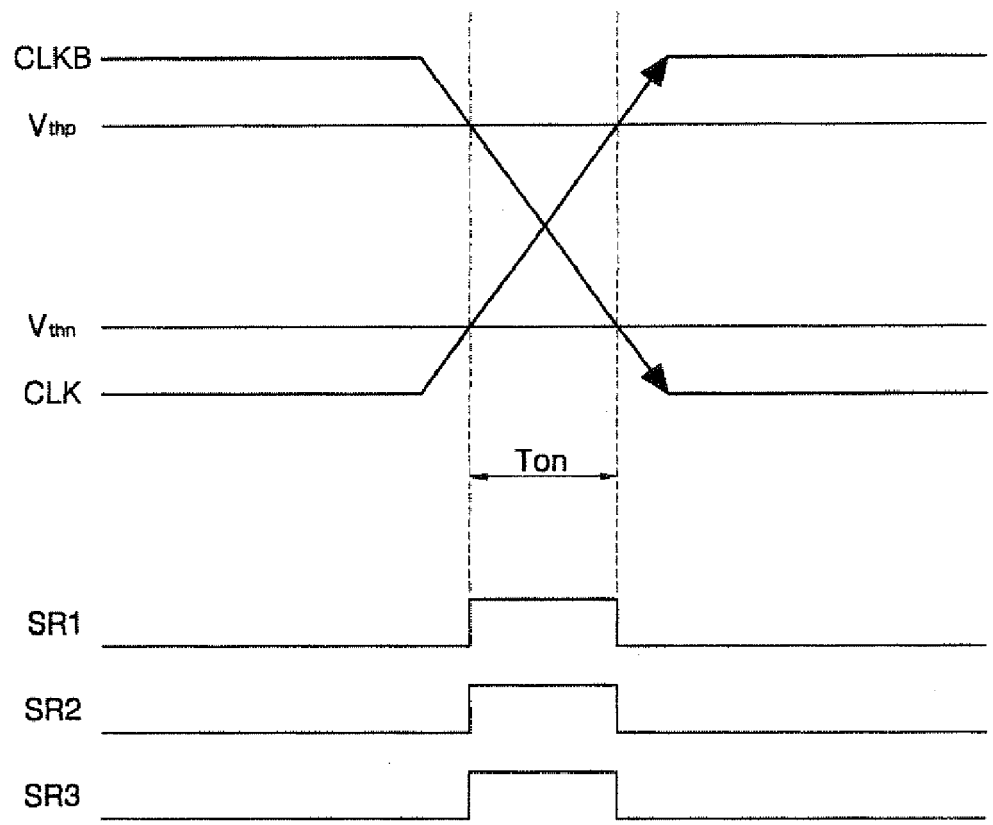
FIG. 4 is a timing diagram showing an output signal error of due to slop between clock and inverted clock signals input to the conventional shift register.

The present invention will now be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity.

Figure 5:
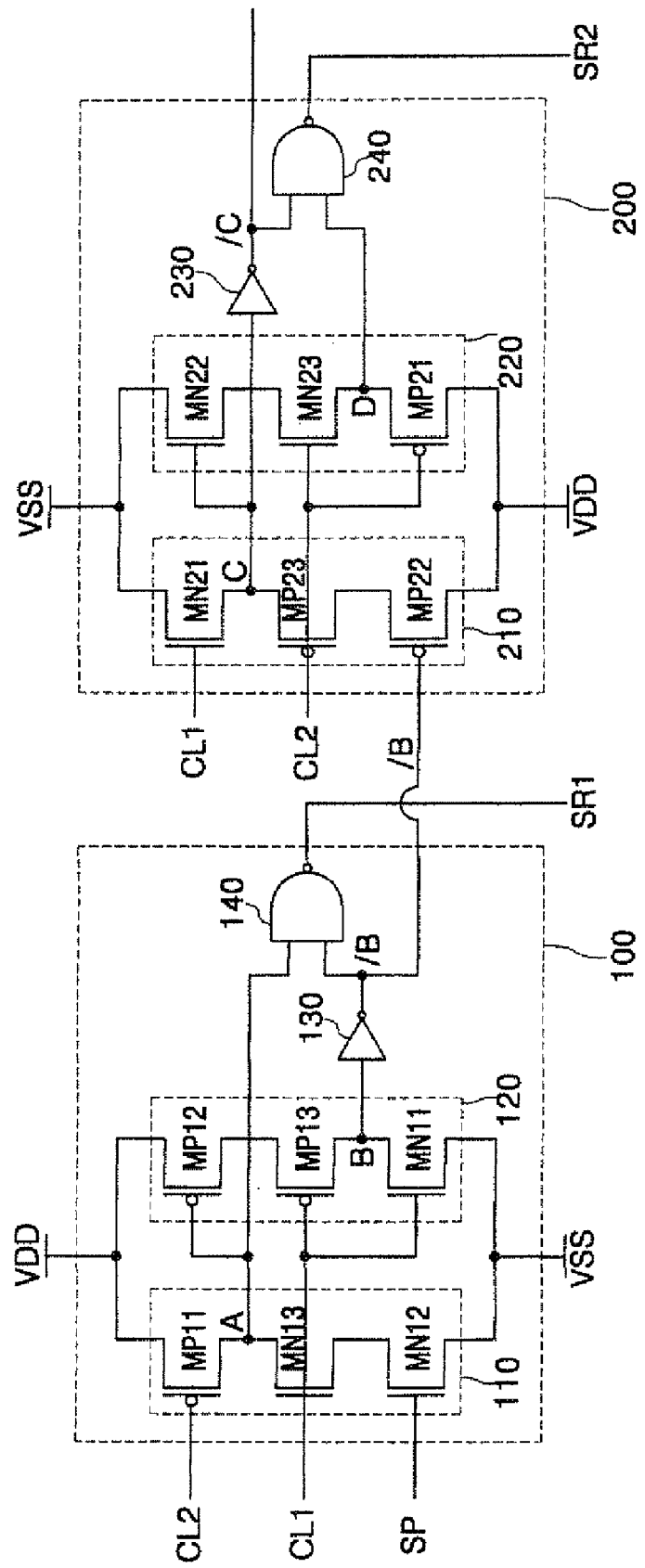
FIG. 5 is a circuit diagram of a shift register in accordance with a first embodiment of the present invention.

FIG. 5 is a circuit diagram of a shift register in accordance with a first embodiment of the present invention.

Referring to FIG. 5, the shift register includes a first shift register 100 and a second shift register 200 among a plurality of shift registers. It is apparent to a person of ordinary skill in the art that multiple shift registers having the same structure as the first and second shift registers 100 and 200 may be repeatedly and serially connected to generate desired output signals. Accordingly, embodiments of the present invention will be described with reference to the two shift registers 100 and 200 as an example.

Referring to FIG. 5, the first shift register 100 includes a first sampling circuit 110, a first holding circuit 120, a first inverter 130, and a first NAND gate 140. The first shift register 100 receives a start pulse SP, a first clock signal CL1, and a second clock signal CL2, and it outputs a first output signal SR1.

The first sampling circuit 110 includes three transistors MP11, MN12, and MN13, and it receives the start pulse SP, the first clock signal CL1, and the second clock signal CL2 to output a first sampling signal A. Transistors MP11, MN12, and MN13 are coupled with one another in series.

More specifically, the transistor MP11 has a source coupled with a positive power supply line VDD, and it performs on and off operations in response to the second clock signal CL2, which is applied to its gate. The transistor MP11 is a P-type metal oxide semiconductor field effect transistor (hereinafter, referred to as PMOSFET).

The transistor MN12 has a source coupled with a negative power supply line VSS, and it performs on and off operations in response to the start pulse SP, which is applied to its gate. The transistor MN12 is an N-type metal oxide semiconductor field effect transistor (hereinafter, referred to as NMOSFET).

The NMOSFET transistor MN13 is coupled between the transistor MP11 and the transistor MN12, and it performs on and off operations in response to the first clock signal CL1, which is applied to its gate.

In the first sampling circuit 110 having the above-described structure, the transistors MP11, MN12, and MN13 perform on and off operations in response to the start pulse SP and each level of the first and second clock signals CL1 and CL2 to output the first sampling signal A.

The first holding circuit 120 includes three transistors MP12, MP13, and MN11, and it receives the first sampling signal A and the first clock signal CL1 and outputs a first holding signal B. The three transistors MP12, MP13, and MN11 are coupled with one another in series.

More specifically, the PMOSFET transistor MP12 has a source coupled with the positive power supply line VDD, and it performs on and off operations in response to the first sampling signal A, which is applied to its gate.

The NMOSFET transistor MN11 has a source coupled with the negative power supply line VSS, and it performs on and off operations in response to the first clock signal CL1, which is applied to its gate.

The PMOSFET transistor MP13 is coupled between the transistor MP12 and the transistor MN11, and it performs on and off operations in response to the first clock signal CL1, which is applied to its gate. The gate of the transistor MN11 and the gate of the transistor MP13 are coupled with each other to receive the first clock signal CL1 in common. Accordingly, the transistor MN11 and the transistor MP13 complementarily perform on and off operations.

In the first holding circuit 120 having the above-described structure, the transistors MP12, MP13, and MN11 perform on and off operations in response to levels of the first sampling signal A and the first clock signal CL1 to output the first holding signal B.

The first inverter 130 receives the first holding signal B of the first holding circuit 120 and outputs a first inverted holding signal /B. The first inverted holding signal /B is input to the second shift register 200, which is described below.

The first NAND gate 140 receives the first sampling signal A of the first sampling circuit 110 and the first inverted holding signal /B and performs a logical operation to output the first output signal SR1. Here, the first output signal SR1 is at a low level only when both the first sampling signal A and the first inverted holding signal /B have high levels, and it is at a high level for the remaining periods.

The second shift register 200 includes a second sampling circuit 210, a second holding circuit 220, a second inverter 230, and a second NAND gate 240. The second shift register 200 receives the first inverted holding signal /B, the first clock signal CL1, and the second clock signal CL2 and outputs a second output signal SR2.

The second sampling circuit 210 includes three transistors MN21, MP22, and MP23, and it receives the first inverted holding signal /B, the first clock signal CL1, and the second clock signal CL2 to output a second sampling signal C. The three transistors MN21, MP22, and MP23 are coupled with one another in series.

More specifically, the NMOSFET transistor MN21 has a source coupled with the negative power supply line VSS, and it performs on and off operations in response to the first clock signal CL1, which is applied to its gate.

The PMOSFET transistor MP22 has a source coupled with the positive power supply line VDD, and it performs on and off operations in response to the first inverted holding signal /B, which is applied to its gate.

The PMOSFET transistor MP23 is coupled between the transistor MN21 and the transistor MP22, and it performs on and off operations in response to the second clock signal CL2, which is applied to its gate.

In the second sampling circuit 210 having the above-described structure, the transistors MP22, MN21, and MP23 perform on and off operations in response to levels of the first inverted holding signal /B, the first clock signal CL1, and the second clock signal CL2, respectively, to output the second sampling signal C.

The second holding circuit 220 includes three transistors MN22, MN23, and MP21, and it receives the second sampling signal C and the second clock signal CL2 to output a second holding signal D. The three transistors MN22, MN23, and MP21 are coupled with one another in series.

More specifically, the NMOSFET transistor MN22 has a source coupled with the negative power supply line VSS, and it performs on and off operations in response to the second sampling signal C, which is applied to its gate.

The PMOSFET transistor MP21 has a source coupled with the positive power supply line VDD, and it performs on and off operations in response to the second clock signal CL2, which is applied to its gate.

The NMOSFET transistor MN23 is coupled between the transistor MN22 and the transistor MP21, and it performs on and off operations in response to the second clock signal CL2, which is applied to its gate. The gate of the transistor MP21 and the gate of the transistor MN23 are coupled with each other to receive the second clock signal CL2 in common. Accordingly, the transistor MP21 and the transistor MN23 complementarily perform on and off operations.

In the second holding circuit 220 having the above-described structure, the transistors MN22, MN23, and MP21 perform on and off operations in response to levels of the second sampling signal C and the second clock signal CL2 to output the second holding signal D.

The second inverter 230 receives the second sampling signal C of the second sampling circuit 210 and outputs a second inverted sampling signal /C. The second inverted sampling signal /C is input to a third shift register (not shown).

The second NAND gate 240 receives the second holding signal D and the second inverted sampling signal /C and performs a logical operation on the received signals to output the second output signal SR2. Hence, the second output signal SR2 is at a low level only when both the second holding signal D and the second inverted sampling signal /C have high levels, and it is at a high level for the remaining periods.

Hereinafter, the operation of the shift register according to the first embodiment of the present invention will be described with reference to FIG. 6.

Figure 6:
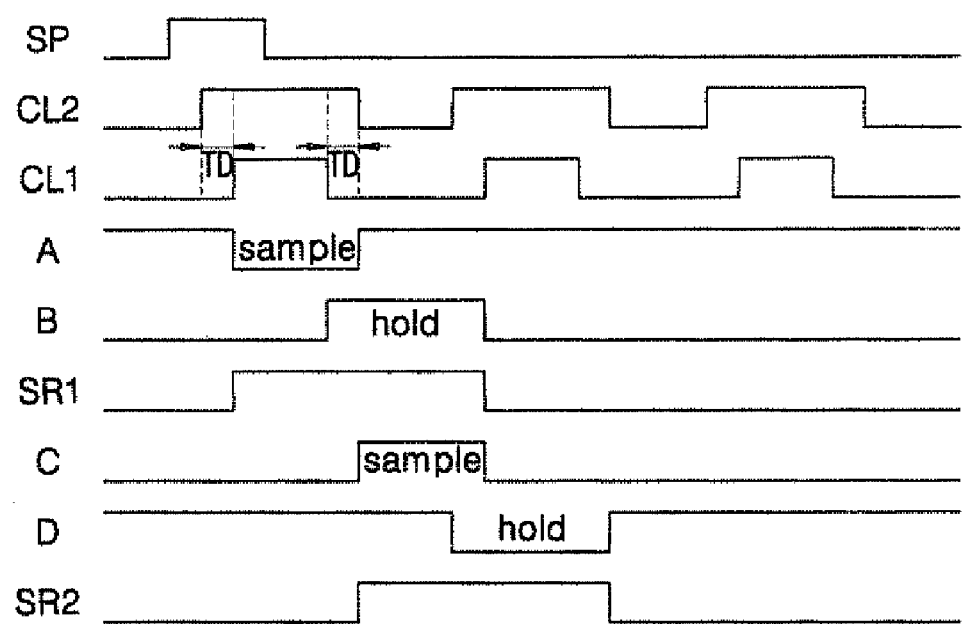
FIG. 6 is a timing diagram of signals input and output during operation of the shift register of FIG. 5

FIG. 6 is a timing diagram of signals input and output during operations of the shift register in accordance with the first embodiment of the present invention.

Referring to FIG. 5 and FIG. 6, in the first shift register 100, the start pulse SP, the first clock signal CL1, and the second clock signal CL2 are applied to the first sampling circuit 110, and the first clock signal CL1 and the first sampling signal A are applied to the first holding circuit 120.

Unlike the conventional clock signals CLK and CLKB, the first clock signal CL1 and the second clock signal CL2 are independent signals, and they have different transition times in order to prevent shift register malfunction even when skew or slop occur between them.

Additionally, a high level interval of the first clock signal CL1 is included in a high level interval of the second clock signal CL2. In other words, the first clock signal CL1 transitions to a high level after the second clock signal transitions to a high level, and the first clock signal CL1 transitions to a low level before the second clock signal transitions to a low level. Hence, the first clock signal CL1 has a smaller duty ratio than the second clock signal CL2. The time delay TD, as shown in FIG. 6, between transitions of the first and second clock signals CL1 and CL2 may be substantially 1 μS to 2 μS. The time delay TD may prevent shift register malfunction even when skew or slop occurs between the clock signals CL1 and CL2.

First, when a high level start pulse SP, a high level first clock signal CL1, and a high level second clock signal CL2 are applied to the first sampling circuit 110, the transistor MN12 and the transistor MN13 are turned on and the transistor MP11 is turned off. Accordingly, the first sampling circuit 110 outputs a first sampling signal A, which has a low level corresponding to the negative power supply voltage VSS, to the second NAND gate 140. That is, the first sampling circuit 110 samples an input signal on a rising edge of the first clock signal CL1 and maintains the signal until a falling edge of the second clock signal CL2.

Subsequently, when a low level first sampling signal A and a low level first clock signal CL1 are applied to the first holding circuit 120, the transistor MP12 and the transistor MP13 are turned on and the transistor MN11 is turned off. Accordingly, the first holding circuit 120 outputs a first holding signal B of a high level, which corresponds to the positive power supply voltage VDD. That is, the first holding circuit 120 holds an input signal on a falling edge of the first clock signal CL1. The first holding signal B is maintained until a rising edge of the first clock signal CL1.

Accordingly, the first NAND gate 140 receives the first sampling signal A and the first inverted holding signal /B and outputs a first output signal SR1 of high level for one period from the rising edge of the first clock signal CL1 to the next rising edge of the first clock signal CL1.

Subsequently, the first inverted holding signal /B, the first clock signal CL1, and the second clock signal CL2 are applied to the second sampling circuit 210, and the second clock signal CL2 and the second sampling signal C are applied to the second holding circuit 220, of the second shift register 200.

When a low level first inverted holding signal /B, a low level first clock signal CL1, and a low level second clock signal CL2 are applied to the second sampling circuit 210, the transistor MP22 and the transistor MP23 are turned on and the transistor MN21 is turned off. Accordingly, the second sampling circuit 210 applies a second sampling signal C of a high level, which corresponds to the positive power supply voltage VDD, to the second inverter 230. That is, the second sampling circuit 210 samples an input signal on a falling edge of the second clock signal CL2, and it maintains the signal until a rising edge of the first clock signal CL1.

Subsequently, when the high level second sampling signal C and a high level second clock signal CL2 are applied to the second holding circuit 220, the transistor MN22 and the transistor MN23 are turned on, and the transistor MP21 is turned off. Accordingly, the second holding circuit 220 applies a second holding signal D of a low level, which corresponds to the negative power supply voltage VSS, to the second NAND gate 240. That is, the second holding circuit 220 holds an input signal on a rising edge of the second clock signal CL2, and it maintains the signal until a falling edge of the second clock signal CL2.

Accordingly, the second NAND gate 240 receives the second holding signal D and the second inverted sampling signal /C, and it outputs a high level second output signal SR2 for one period from the falling edge of the second clock signal CL2 to the next falling edge of the second clock signal CL2.

The first and second shift registers 100 and 200, which perform the above-described operations, are repeatedly and serially connected, and they can generate output signals SR1, SR2, ..., SRn, which are shifted by a predetermined interval in response to states of the two independently applied clock signals CL1 and CL2.

Accordingly, the shift register according to the first embodiment of the present invention does not have the first clock signal CL1 and the second clock signal CL2 simultaneously transitioning or overlapping, unlike the conventional shift register, so that it may operate independent of the skew or slop between the two signals CL1 and CL2. That is, the first clock signal CL1 and the second clock signal CL2 have different duty ratios to utilize the time delay TD, so that problems due to skew basically do not occur. Additionally, even when the slop increases, sequential logic operations are turned on at the same time so that malfunction due to slop does not occur.

Furthermore, the shift register according to the first embodiment of the present invention has a three-stack structure in which three transistors are stacked between the positive power supply voltage and the negative power supply voltage. Hence, a voltage drop due to on-resistance of the transistors decreases as compared to the conventional four-stack structure, thereby permitting a lower power supply voltage to be used, which in turn allows reduced power consumption.

The shift register according to the first embodiment of the present invention described above may be used in various application fields. In particular, it may be used in a scan driving unit to supply a scan signal, or in an emission control driving unit to supply an emission control signal, to a display panel.

Hereinafter, an organic light emitting display in which the shift register according to the first embodiment of the present invention is representatively used will be described.

Second Embodiment

Figure 7:
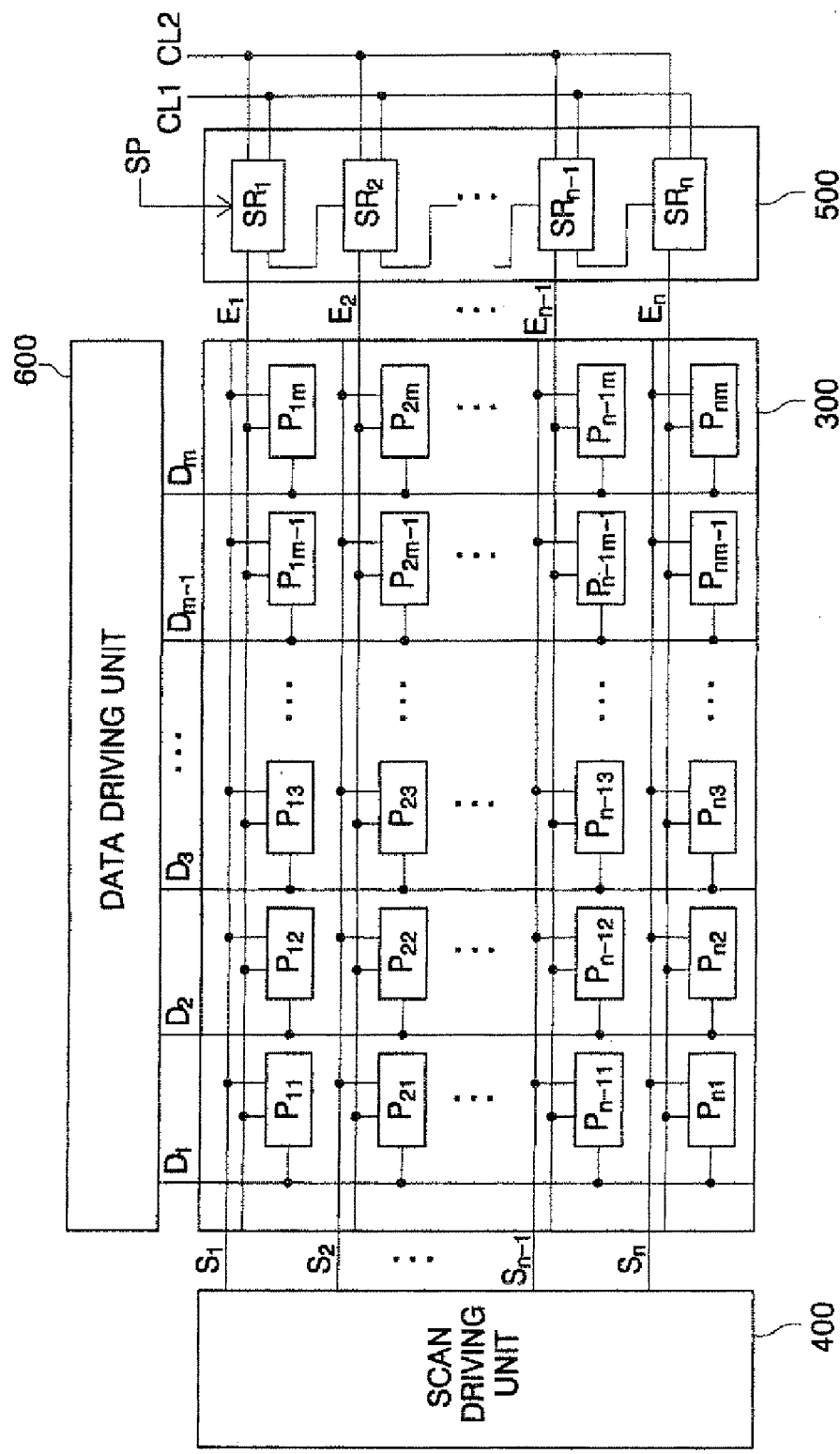
FIG. 7 is a block diagram showing an organic light emitting display including the shift register of FIG. 5 in accordance with a second embodiment of the present invention.

FIG. 7 is a block diagram of an organic light emitting display including the shift register of FIG. 5 in accordance with a second embodiment of the present invention.

Referring to FIG. 7, the organic light emitting display includes a pixel unit 300, a scan driving unit 400, an emission control driving unit 500, and a data driving unit 600.

The pixel unit 300 has a plurality of pixels $P_{11}$ to $P_{nm}$ formed at crossing regions of a plurality of data lines $D_1$ to $D_m$, a plurality of scan lines $S_1$ to $S_n$, and a plurality of emission control lines $E_1$ to $E_n$.

The scan driving unit 400 sequentially applies selection signals to the scan lines $S_1$ to $S_n$ to activate the pixels $P_{11}$ to $P_{nm}$.

The data driving unit 600 applies data signals to the data lines $D_1$ to $D_m$ of activated pixels in synchronization with the selection signal and the emission control signal.

The emission control driving unit 500 sequentially applies emission control signals to the emission control lines $E_1$ to $E_{nm}$ to control emission times of the pixels $P_{11}$ to $P_{nm}$.

The shift register according to the first embodiment acts as the emission control driving unit 500 of the organic light emitting display in the second embodiment, and the shift registers $SR_1$ to $SR_n$ are cascaded to the emission control lines $E_1$ to $E_n$ to apply the emission control signal.

Hereinafter, the shift registers $SR_1$ to $SR_n$ according to the first embodiment will be referred to in the emission control driving unit 500 in the organic light emitting display in accordance with the second embodiment of the present invention.

The pixel unit 300, the scan driving unit 400, and the emission control driving unit 500 may be formed using thin film transistors formed of polycrystalline silicon (polysilicon) by a low temperature polysilicon (LTPS) method.

Operation of a representative pixel circuit formed in the pixel unit 300 will be described below.

Figure 8:
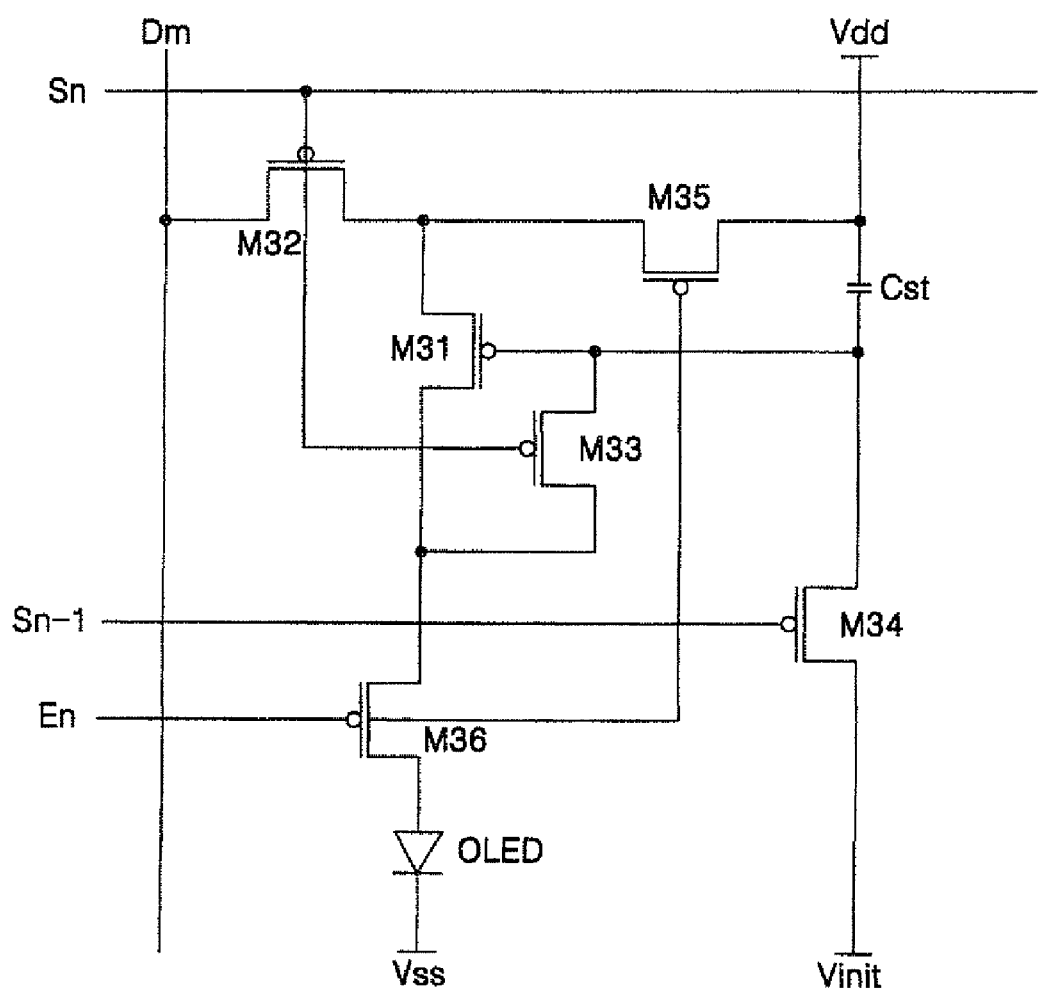
FIG. 8 is a circuit diagram of a representative pixel among pixels shown in FIG. 7.
Figure 9:
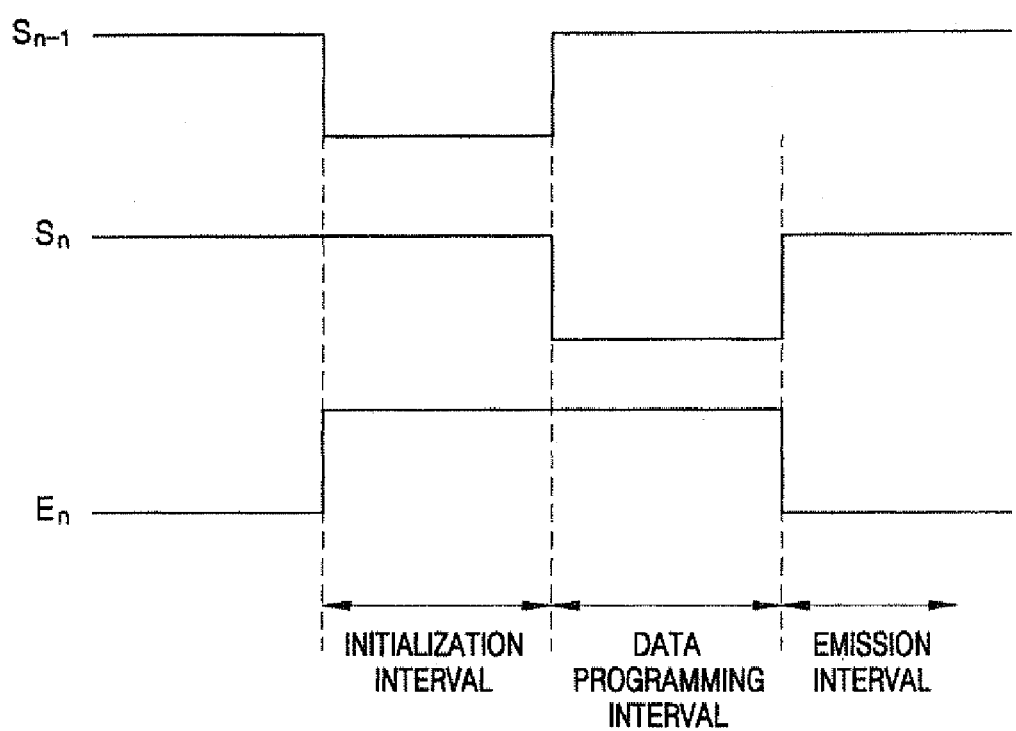
FIG. 9 is a timing diagram of signals that may be used to operate the pixel circuit of FIG. 8.

FIG. 8 is a circuit diagram of a representative pixel among pixels shown in FIG. 7, and FIG. 9 is a timing diagram showing signals that may be used to operate the pixel circuit.

Referring to FIG. 8 and FIG. 9, the pixel circuit includes an organic light emitting diode OLED and a pixel driving circuit to drive the organic light emitting diode OLED.

The pixel driving circuit includes six transistors M31, M32, M33, M34, M35 and M36 and one capacitor Cst.

A selection signal is applied to an nth scan line Sn corresponding to a gate of the second transistor M32, a data line D$_m$ is coupled with its source and a data signal is applied thereto, and its drain is coupled with a source of the first transistor M31.

A gate of the first transistor M31 is coupled with a first terminal of the capacitor Cst, and its drain is coupled with a first terminal of the organic light emitting diode OLED. The drain and source of the third transistor M33 are coupled with the gate and drain of the first transistor M31, respectively, and the selection signal applied to the nth scan line Sn is applied to a gate of the third transistor M33.

A power supply voltage is applied from the corresponding power supply line Vdd to a second terminal of the capacitor Cst. An emission control signal is applied to a gate of the fifth transistor M35, a power supply voltage is applied from the power supply line Vdd to a source of the fifth transistor M35, and a drain of the fifth transistor M35 is coupled with the drain of the second transistor M22.

An emission control signal is applied to a gate of the sixth transistor M36, its source is coupled with the drain of the first transistor M31, and its drain is coupled with the first terminal of the organic light emitting diode OLED. A selection signal applied to an (n−1)th scan line Sn−1 is applied to a gate of the fourth transistor M34, its source is coupled with the first terminal of the capacitor Cst, and its drain is coupled with an initial voltage line Vinit so that an initial voltage is applied thereto.

The organic light emitting diode OLED includes a pixel electrode, a counter electrode, and an organic emission layer interposed between the pixel electrode and the counter electrode.

The operation of the pixel having the structure of FIG. 8 will be described with reference to the timing diagram of FIG. 9.

First, during an initialization interval, in which a selection signal of an (n−1)th scan line Sn−1 is a low level and signals of an emission control line En and an nth scan line Sn are high levels, the fourth transistor M34 is turned on by the selection signal of the (n−1)th scan line Sn−1, and the first to third transistors M31 to M33 and the fifth and sixth transistors M35 and M36 are turned off by the selection signal of the nth scan line Sn and the emission control signal of the emission control line En. Accordingly, data stored in the capacitor Cst, i.e., a gate voltage of the first transistor M31, is initialized.

Next, during a data programming interval, in which the selection signal of the (n−1)th scan line Sn−1 is a high level, the selection signal of the nth scan line Sn is a low level, and the emission control signal of the emission control line En is a high level, the fourth transistor M34 is turned off and the third transistor M33 is turned on by the low level selection signal of the nth scan line Sn, thereby diode-connecting the first transistor M31.

The second transistor M32 is also turned on by the selection signal of the nth scan line Sn, and the fifth and sixth transistors M35 and M36 are turned off by the emission control signal of the emission control line En. That is, the first transistor M31 is diode-connected so that Vdata−Vth$_{M31}$ may be applied to the gate of the first transistor M31 as a gate voltage, which is stored in the capacitor Cst to terminate the programming operation.

Finally, during an emission interval, in which the selection signal of the (n−1)th scan line Sn−1 is a high level, the emission control signal of the emission control line En is a low level, and the selection signal of the nth scan line Sn is a high level, the fifth and sixth transistors M35 and M36 are turned on by the low level emission control signal of the emission control line En, the fourth transistor M34 is turned off by the high level selection signal of the (n−1)th scan line Sn−1, and the second transistor M32 and the third transistor M33 are turned off by the high level selection signal of the nth scan line Sn. Accordingly, a driving current, which corresponds to the data signal, flows into the organic light emitting diode OLED via the first transistor M31, so that the organic light emitting diode OLED emits light.

The current flowing through the organic light emitting diode OLED may be determined as follows:

$$I_{OLED}=k(Vgs-Vth_{M31})^2=K\{Vdd-(Vdata-Vth_{M31})-Vth_{M31}\}^2=k(Vdd-Vdata)^2 \quad \text{Equation 1}$$

As expressed in Equation 1, the threshold voltage of the driving transistor M31 may be compensated for in order to emit light having uniform luminance.

The shift register according to the first embodiment of the present invention acts to apply the emission control signal to the above-described pixel circuit.

Accordingly, the organic light emitting display according to the second embodiment of the present invention applies the emission control signal using the shift register according to the first embodiment of the present invention. Hence, problems due to skew or slop may not occur, thereby preventing display malfunction due to a distorted emission control signal.

Additionally, the shift register of the present invention has a three-stack structure in which three transistors are stacked between the positive power supply voltage and the negative power supply voltage, thereby decreasing a voltage drop due to on-resistance of the transistors. This allows utilization of a power supply voltage that is less than that of the conventional four-stack structure, which reduces power consumption.

According to embodiments of the present invention as described above, the first clock signal and the second clock signal, which have different duty ratios and are applied independently from each other, do not transition at the same time and have an overlapping interval therebetween, so that they have properties independent of skew or slop between the two signals. Accordingly, a more reliable shift register, and an organic light emitting display including the same, can be provided.

Accordingly, a shift register of the present invention and an organic light emitting display including the same may have reduced power consumption, and they may stably operate even in the presence of external noise.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light emitting display, comprising:
   a pixel unit to display an image, the pixel unit comprising a plurality of pixels arranged at crossing regions of a plurality of data lines, a plurality of scan lines and a plurality of emission control lines;
   a scan driving unit coupled with the scan lines to apply selection signals for activating pixels;
   a data driving unit coupled with the data lines to apply data signals to the activated pixels; and
   an emission control driving unit coupled with the emission control lines to apply emission control signals to the activated pixels having the applied data signals,
   wherein the emission control driving unit comprises:

a first shift register to receive a start pulse and to output a first emission control signal for one period of a first clock signal in response to the start pulse, the first clock signal, and a second clock signal; and a second shift register to output a second emission control signal for one period of the second clock signal in response to an input signal, the first clock signal, and the second clock signal, the input signal being delivered from the first shift register, wherein the first shift register and the second shift register are repeatedly and serially connected by a number corresponding to the number of emission control lines, and a duty ratio of the first clock signal is smaller than a duty ratio of the second clock signal, wherein the first shift register comprises:
- a first sampling circuit to sample an input signal on a rising edge of the first clock signal;
- a first holding circuit to hold the input signal on a falling edge of the first clock signal;
- a first inverter to invert only an output signal of the first holding circuit; and
- a first NAND gate to receive an output signal of the first sampling circuit and an output signal of the first inverter, and to perform a logical operation on the received output signals to output the first emission control signal.

2. The organic light emitting display of claim 1, wherein the first clock signal transitions to a high level after the second clock signal transitions to a high level, and the first clock signal transitions to a low level before the second clock signal transitions to a low level.

3. The organic light emitting display of claim 2, the first clock signal transitions to the high level 1 μS to 2 μS after the second clock signal transitions to the high level, and the first clock signal transitions to the low level 1 μS to 2 μS before the second clock signal transitions to the low level.

4. The organic light emitting display of claim 3, wherein the first sampling circuit comprises:
- a first transistor coupled with a positive power supply line and to perform on and off operations in response to the second clock signal to selectively output the positive power supply voltage;
- a second transistor coupled with a negative power supply line and to perform on and off operations in response to the start pulse to selectively deliver the negative power supply voltage; and
- a third transistor coupled between the first transistor and the second transistor and to perform on and off operations in response to the first clock signal to selectively output the negative power supply voltage delivered from the second transistor.

5. The organic light emitting display of claim 4, wherein the first transistor is a P-type metal oxide semiconductor (MOS) transistor, and the second transistor and the third transistor are N-type MOS transistors.

6. The organic light emitting display of claim 5, wherein the first holding circuit comprises:
- a fourth transistor coupled with the positive power supply line and to perform on and off operations in response to the output signal of the first sampling circuit to selectively deliver the positive power supply voltage;
- a fifth transistor coupled with the negative power supply line and to perform on and off operations in response to the first clock signal to selectively output the negative power supply voltage; and
- a sixth transistor coupled between the fourth transistor and the fifth transistor and to perform on and off operations in response to the first clock signal to selectively output the positive power supply voltage delivered from the fourth transistor.

7. The organic light emitting display of claim 6, wherein the fourth transistor and the sixth transistor are P-type MOS transistors, and the fifth transistor is an N-type MOS transistor.

8. The organic light emitting display of claim 7, wherein the second shift register comprises:
- a second sampling circuit to sample an input signal on a falling edge of the second clock signal;
- a second holding circuit to hold the input signal on a rising edge of the second clock signal;
- a second inverter to invert an output signal of the second sampling circuit; and
- a second NAND gate to receive an output signal of the second holding circuit and an output signal of the second inverter, and to perform a logical operation on the received output signals to output the second emission control signal.

9. The organic light emitting display of claim 8, wherein the second sampling circuit comprises:
- a seventh transistor coupled with the negative power supply line and to perform on and off operations in response to the first clock signal to selectively output the negative power supply voltage;
- an eighth transistor coupled with the positive power supply line and to perform on and off operations in response to the output signal of the first inverter to selectively deliver the positive power supply voltage; and
- a ninth transistor coupled between the seventh transistor and the eighth transistor and to perform on and off operations in response to the second clock signal to selectively output the positive power supply voltage delivered from the eighth transistor.

10. The organic light emitting display of claim 9, wherein the seventh transistor is an N-type MOS transistor, and the eighth transistor and the ninth transistor are P-type MOS transistors.

11. The organic light emitting display of claim 10, wherein the second holding circuit comprises:
- a tenth transistor coupled with the negative power supply line and to perform on and off operations in response to the output signal of the second sampling circuit to selectively deliver the negative power supply voltage;
- an eleventh transistor coupled with the positive power supply line and to perform on and off operations in response to the second clock signal to selectively output the positive power supply voltage; and
- a twelfth transistor coupled between the tenth transistor and the eleventh transistor and to perform on and off operations in response to the second clock signal to selectively output the negative power supply voltage delivered from the tenth transistor.

12. The organic light emitting display of claim 11, wherein the tenth transistor and the twelfth transistor are N-type MOS transistors, and the eleventh transistor is a P-type MOS transistor.

13. A shift register, comprising:
- a first shift register to receive a start pulse and to output a first signal for one period of a first clock signal in response to the start pulse, the first clock signal, and a second clock signal; and
- a second shift register to output a second signal for one period of the second clock signal in response to an input signal, the first clock signal, and the second clock signal, the input signal being delivered from the first shift register, wherein the first shift register and the second shift register are repeatedly and serially connected by a number corresponding to the number of emission control lines, and a duty ratio of the first clock signal is smaller than a duty ratio of the second clock signal, wherein the first shift register comprises:
a first sampling circuit to sample an input signal on a rising edge of the first clock signal;
a first holding circuit to hold the input signal on a falling edge of the first clock signal;
a first inverter to invert only an output signal of the first holding circuit; and
a first NAND gate to receive an output signal of the first sampling circuit and an output signal of the first inverter, and to perform a logical operation on the received output signals to output the first signal.

14. The shift register of claim 13, wherein the first clock signal transitions to a high level after the second clock signal transitions to a high level, and the first clock signal transitions to a low level before the second clock signal transitions to a low level.

15. The shift register of claim 14, wherein the first clock signal transitions to the high level 1 μS to 2 μS after the second clock signal transitions to the high level, and the first clock signal transitions to the low level 1 μS to 2 μS before the second clock signal transitions to the low level.

16. The shift register of claim 15, wherein the first sampling circuit comprises:
a first transistor coupled with a positive power supply line and to perform on and off operations in response to the second clock signal to selectively output the positive power supply voltage;
a second transistor coupled with a negative power supply line and to perform on and off operations in response to the start pulse to selectively deliver the negative power supply voltage; and
a third transistor coupled between the first transistor and the second transistor and to perform on and off operations in response to the first clock signal to selectively output the negative power supply voltage delivered from the second transistor.

17. The shift register of claim 16, wherein the first transistor is a P-type metal oxide semiconductor (MOS) transistor, and the second transistor and the third transistor are N-type MOS transistors.

18. The shift register of claim 17, wherein the first holding circuit comprises:
a fourth transistor coupled with the positive power supply line and to perform on and off operations in response to the output signal of the first sampling circuit to selectively deliver the positive power supply voltage;
a fifth transistor coupled with the negative power supply line and to perform on and off operations in response to the first clock signal to selectively output the negative power supply voltage; and a sixth transistor coupled between the fourth transistor and the fifth transistor and to perform on and off operations in response to the first clock signal to selectively output the positive power supply voltage delivered from the fourth transistor.

19. The shift register of claim 18, wherein the fourth transistor and the sixth transistor are P-type MOS transistors, and the fifth transistor is an N-type MOS transistor.

20. The shift register of claim 19, wherein the second shift register comprises:
a second sampling circuit to sample an input signal on a falling edge of the second clock signal;
a second holding circuit to hold the input signal on a rising edge of the second clock signal;
a second inverter to invert an output signal of the second sampling circuit; and
a second NAND gate to receive an output signal of the second holding circuit and an output signal of the second inverter, and to perform a logical operation on the received output signals to output the second signal.

21. The shift register of claim 20, wherein the second sampling circuit comprises:
a seventh transistor coupled with the negative power supply line and to perform on and off operations in response to the first clock signal to selectively output the negative power supply voltage;
an eighth transistor coupled with the positive power supply line and to perform on and off operations in response to the output signal of the first inverter to selectively deliver the positive power supply voltage; and
a ninth transistor coupled between the seventh transistor and the eighth transistor and to perform on and off operations in response to the second clock signal to selectively output the positive power supply voltage delivered from the eighth transistor.

22. The shift register of claim 21, wherein the seventh transistor is an N-type MOS transistor, and the eighth transistor and the ninth transistor are P-type MOS transistors.

23. The shift register of claim 22, wherein the second holding circuit comprises:
a tenth transistor coupled with the negative power supply line and to perform on and off operations in response to the output signal of the second sampling circuit to selectively deliver the negative power supply voltage;
an eleventh transistor coupled with the positive power supply line and to perform on and off operations in response to the second clock signal to selectively output the positive power supply voltage; and
a twelfth transistor coupled between the tenth transistor and the eleventh transistor and to perform on and off operations in response to the second clock signal to selectively output the negative power supply voltage delivered from the tenth transistor.

24. The shift register of claim 23, wherein the tenth transistor and the twelfth transistor are N-type MOS transistors, and the eleventh transistor is a P-type MOS transistor.

* * * * *